United States Patent [19]

Giffin et al.

[11] 4,161,356

[45] Jul. 17, 1979

[54] APPARATUS FOR IN-SITU PROCESSING OF PHOTOPLATES

[76] Inventors: James W. Giffin, 4653 Columbia River Ct., San Jose, Calif. 95136; Michael A. De Santis, 3116 Penetencia Creek Rd., San Jose, Calif. 95132; John S. Burchard, 630 Dorrance Rd., Boulder Creek, Calif. 95006

[21] Appl. No.: 807,884

[22] Filed: Jun. 20, 1977

Related U.S. Application Data

[62] Division of Ser. No. 761,135, Jan. 21, 1977, abandoned.

[51] Int. Cl.² ............................. G03D 3/02; B08B 3/02
[52] U.S. Cl. ..................................... 354/323; 354/325; 354/326; 134/149; 134/153; 156/345
[58] Field of Search ............... 354/306, 312, 315, 317, 354/323, 324, 325, 326, 331, 337; 134/149, 151, 153, 199, 200; 156/345, 640, 659; 96/36, 36.2

[56] References Cited

U.S. PATENT DOCUMENTS

| | | | |
|---|---|---|---|
| 2,532,855 | 12/1950 | Rabkin et al. | 354/306 |
| 3,041,225 | 6/1962 | Emeis | 134/153 |
| 3,401,705 | 9/1968 | Goldware | 134/151 |
| 3,489,608 | 1/1970 | Jacobs et al. | 134/149 |
| 3,494,815 | 2/1970 | Yoshimatsu | 134/153 |
| 3,619,601 | 11/1971 | Gush | 354/306 |
| 3,727,620 | 4/1973 | Orr | 134/153 |
| 3,769,992 | 11/1973 | Wallestad | 134/153 |
| 3,953,265 | 4/1976 | Hood | 156/345 |
| 4,092,176 | 5/1978 | Kozai et al. | 134/199 |

*Primary Examiner*—L. T. Hix
*Assistant Examiner*—Alan Mathews
*Attorney, Agent, or Firm*—Thomas Schneck

[57] ABSTRACT

An apparatus for in-situ processing of photoplates which minimizes photoplate contamination. Frustroconical sloping walls are provided in opposed bowl-shaped mating domes containing a centrally disposed photoplate mounted for rotation. Condensing vapor or nozzle drippings are guided by the sloping walls away from the photoplate.

4 Claims, 7 Drawing Figures

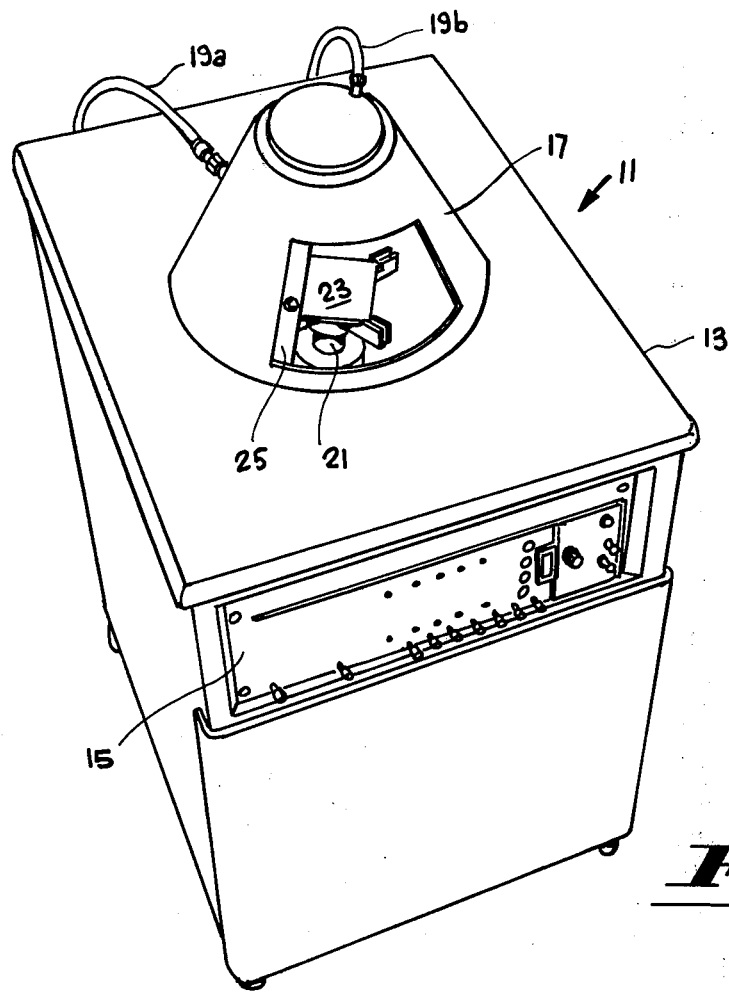
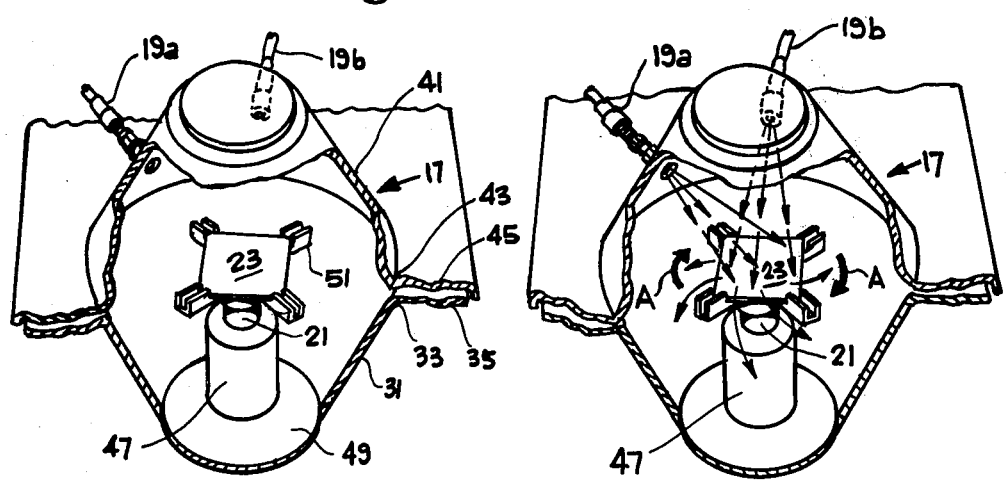
Fig.1
Fig.2  Fig.3

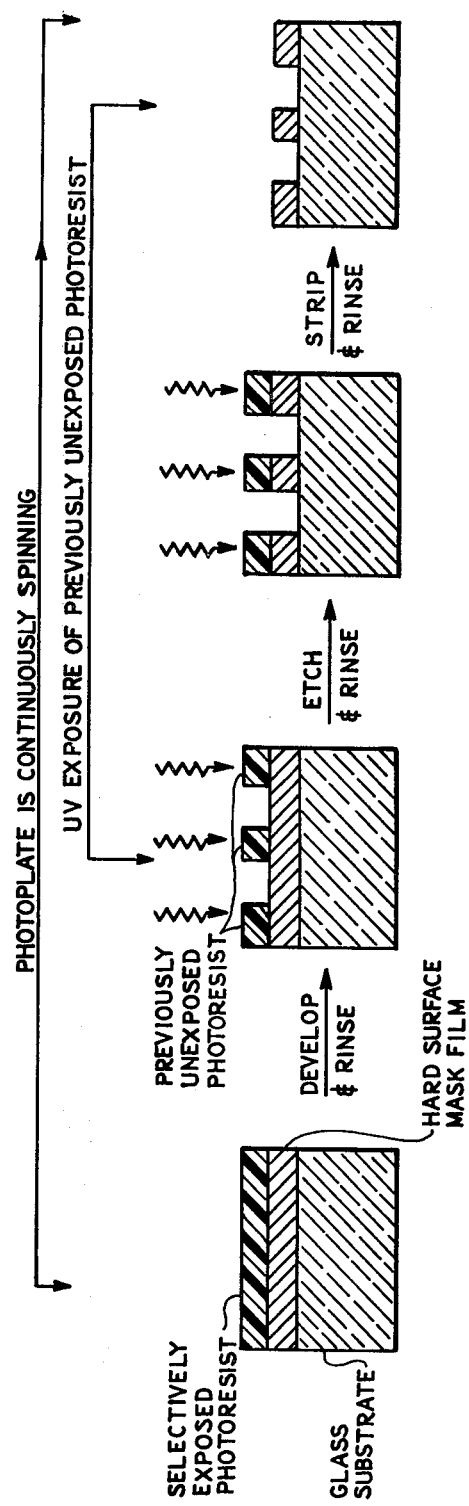

APPARATUS FOR IN-SITU PROCESSING OF PHOTOPLATES

This is a division of application Ser. No. 761,135, filed Jan. 21, 1977, now abandoned.

BACKGROUND OF THE INVENTION a. Field of the Invention

This invention relates generally to spin-spray processing and more particularly to a method and apparatus for spin-spray processing of photoplates used for integrated circuit construction.

b. Prior Art

Spin-spray processing is old. For example, it has been used in the manufacture of semiconductor wafers. U.S. Pat. No. 3,953,265, incorporated by reference herein, shows a method and apparatus for handling fluids in semiconductor processing. Similarly, U.S. Pat. Nos. 3,041,225 and 3,489,608 both incorporated by reference herein, also show an apparatus for surface treatment of semiconductor bodies, including a structure for spin etching of semiconductors.

Previously, photomasks have not been processed by spin-spray technology for various reasons. Rather, classical photographic development techniques have been used wherein photoplates for making photomasks are transferred from one chemical bath to another. The typical time for processing a photoplate utilizing current methods and apparatus is approximately 24 minutes. During this time the photoplate is exposed to ambient air and often particles land on the photoplate which subsequently degrade the performance of it, when used to make semiconductor integrated circuits. Moreover, the amount of space occupied by a plurality of chemical baths is considerable.

Accordingly, it was our object to devise a spin-spray processing method and apparatus for photoplates wherein the amount of time required to process a photoplate could be reduced; the photoplate surface could be kept relatively free of particulate matter; the overall amount of space required to process photoplates could be dramatically reduced; and the number of processing chemicals is reduced.

SUMMARY OF THE INVENTION

The above objects have been satisfied with a method and apparatus for in-situ processing of photoplates wherein a hollow chamber is provided with a spinner chuck therein and spray jets mounted flush against the inside walls of the chamber. The spray jets sequentially provide the necessary developer, rinse and etchant for processing photoplates. An actinic radiation source is mounted in the chamber facing the photoplate for exposing previously unexposed photoresist material on the photoplate as part of a novel method for completely stripping the photoplate of all photoresist material before the photoplate is removed from the chamber.

In the method of the present invention, a selectively exposed photoresist coated photoplate is placed on the spinner chuck. After being rotated, developer and rinse are sprayed onto the rotating photoplate. Then, etchant is sprayed onto the photoplate to remove photoplate material underlying the photoresist regions which have been previously removed. There remains on the photoplate unexposed photoresist. However, the radiation source in the chamber is activated to expose these regions which are subsequently sprayed with developer and rinse to strip away the now exposed remainder of photoresist coating. The photoplate is then dried and a processed photomask is what remains.

A BRIEF DESCRIPTION OF THE DRAWINGS

FIG. 1 is a front perspective view of the apparatus of the present invention.

FIG. 2 is a front cutaway view of the chamber of the apparatus shown in FIG. 1.

FIG. 3 is an action view of the chamber shown in FIG. 2.

FIG. 7 is a diagrammatic view illustrating the method of the present invention.

DESCRIPTION OF THE PREFERRED EMBODIMENT

Figure 5:
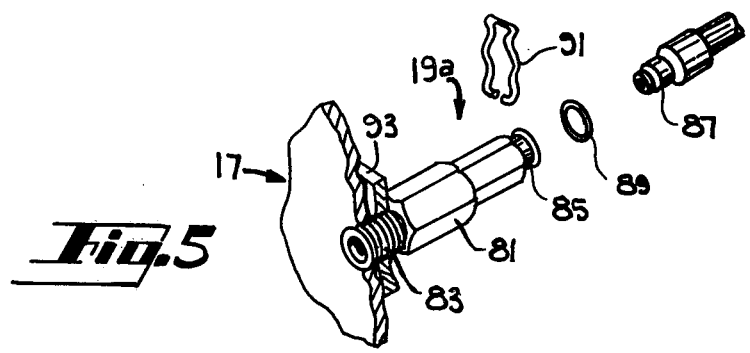
FIG. 5 is a cutaway exploded view of the mounting detail for spray jets mounted in the wall of the chamber of the apparatus.

With reference to FIG. 1, the photoplate processing apparatus 11 is shown. The apparatus includes a cabinet 13 having upper surface dimensions of approximately 24 inches by 25 inches, although these dimensions are not critical. The cabinet is approximately 30 inches high to the flat upper working surface. A control panel 15 is located just below the front working surface, behind a front panel of the cabinet. A chamber 17 is disposed in the central region of the upper work surface of cabinet 13 and has spray jet means 19a, 19b connected to the chamber. Inside of chamber 17, a spinner chuck 21 is mounted from below. A photoplate 23 is mounted on the spinner chuck and is placed thereon through a slideable door 25 shown in the open position.

With reference to FIG. 2, some of the construction details of the chamber 17 may be seen. Chamber 17 comprises a lower bowl-shaped member 31 which has an upper rim 33 which flattens out into a planar region 35.

An upper bowl-shaped member 41 forms the upper half of the chamber and has a rim 43 which is disposed adjacent to the rim 33 of the lower bowl-shaped member 31. Rim 43 flattens out to a planar region 45 which forms the upper work surface of cabinet 13.

In practice, the lower bowl-shaped member 31 is formed from a single sheet of plastic, such as by vacuum forming, as is the upper bowl-shaped member 41. The two pieces are brought together so that the two rims 33 and 43 are adjacently positioned and then the flat portions of the rims 35 and 45 are adhered together, such as by bonding.

It will be noted that the chamber has a double conical shape, i.e. one truncated cone mounted directly over the rim of another inverted cone of similar dimensions. Since these cones have truncated bases, they are termed frustro-conical members. While the conical shape is not critical, it has an advantageous funnel or bowl shape which encourages fluid in the chamber to funnel downwardly to the base thereof where it can be readily collected and drained. In order to achieve this, the lower bowl-shaped member should have inwardly and downwardly sloping walls, rather than flat side walls. The geometric property of sloping inwardly and downwardly is commonly possessed by bowls and hence the bowl-shaped members forming the chamber herein are members having side walls which slope inwardly and downwardly when forming the lower member of chamber 17. An analogous structure is used for the upper member of chamber 17.

The upper bowl-shaped member 41 has spray jets 19a, 19b projecting therein, with the nozzle of each respective jet flush with the inside wall of upper chamber 41. Hence, if either nozzle tends to drip fluids, such fluids will drain down the chamber wall and be collected at the bottom of the chamber, rather than drip onto the photoplate which would be the case if the nozzle projected into the chamber and over the photoplate.

The spinner chuck 21 is driven by a motor 47 which is mounted vertically and projects into the lower bowl-shaped member 31 with a base plate 49 mounting the motor at the base of the chamber. A drain hole, not shown, is provided around the periphery of base plate 49 for fluid collection and removal from the chamber. The top of the spinner chuck contains a conventional photoplate holder which, by means of a four-armed staircase configuration holds standard size photoplates by securing corners of the photoplate between two parallel prongs of each arm.

FIG. 3 is an action view of spinner chuck 21 being driven by motor 47. This view shows spray jets 19a, 19b dispensing photoplate processing fluid onto photoplate 23 as the photoplate is being rotated in the direction indicated by the arrows A. In practice only one jet would operate at a time because each jet is connected to a separate chemical supply.

Figure 4:
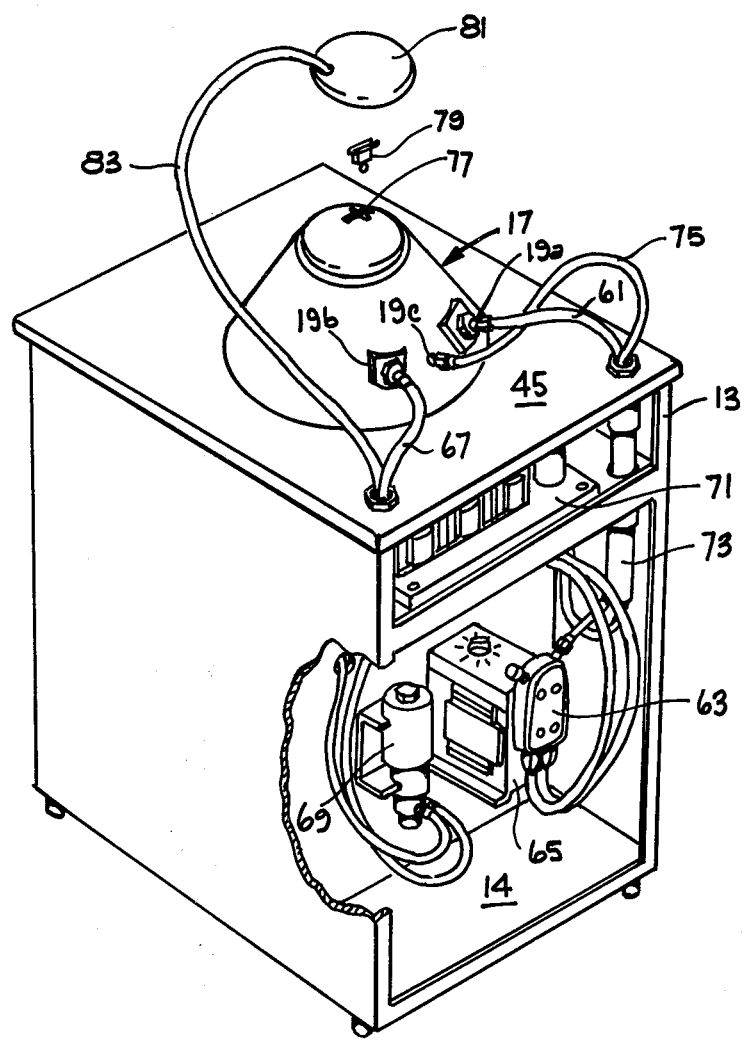
FIG. 4 is a rear perspective view of the apparatus shown in FIG. 1.

In the rear cutaway perspective of FIG. 4 the spray jets 19a, 19b may be seen to be connected to respective pumps. Specifically, nozzle 19a is designated as an etch nozzle which is connected by means of a plastic tubing 61 to etch pump 63, which has a pressure unit 65 mounted directly behind it such that the diaphragm of the pressure unit such as a compressor, directly feeds the etch pump 63.

Spray jet 19b, designated as the developer jet, is connected by means of tubing 67 to developer pump 69. Both the developer pump 69 and the etch pump 63 are connected to reservoirs, usually bottles, of developer and etch solution which are placed on the floor 14, of cabinet 13. A power supply 71 for the apparatus is mounted directly below the upper work surface which is formed by the extended planar rim portions 35, 45 of the lower and upper bowl-shaped members which define the closed chamber 17.

A controller, mounted forward of power supply 71, provides timing and control signals for pumps 63 and 69, as well as the water solenoid 73 which can feed a water stream through plastic tubing 75 into spray jet 19c.

The upper portion of chamber 17 has an aperture 77 through which a lamp 79 is mounted. A lamp holder 81 supplies electricity to lamp 79 from power supply 71 through electrical conduit 83 which is also plastic tubing. Lamp 79 should be an actinic radiation source for photoresist coatings used on photoplates. The lower portion of cabinet 13 also includes a drain, not shown, for removing certain of the photoplates processing fluids from the bottom of chamber 17.

FIG. 5 shows the details of mounting a spray jet means, 19a to the wall of the chamber 17. The spray jet consists of a barrel 81 which has threads 83 on the nozzle tip side and a sleeve 85 on the supply side. A connector 87 which nests within sleeve 85 is positioned therein after passing through a sealing O-ring 89. A clip 91 holds connector 87 in sealed relationship to sleeve 85 after the two have been compressibly fit together. The threaded end 83 of barrel 81 is screwed through a backing plate 93 and the nozzle tip of the spray jet means 19a is mounted flush with the inside wall of chamber 17. The nozzle tips are of the Fulljet and T-jet type nozzles available from Spraying Systems, Inc., of Illinois.

Figure 6:
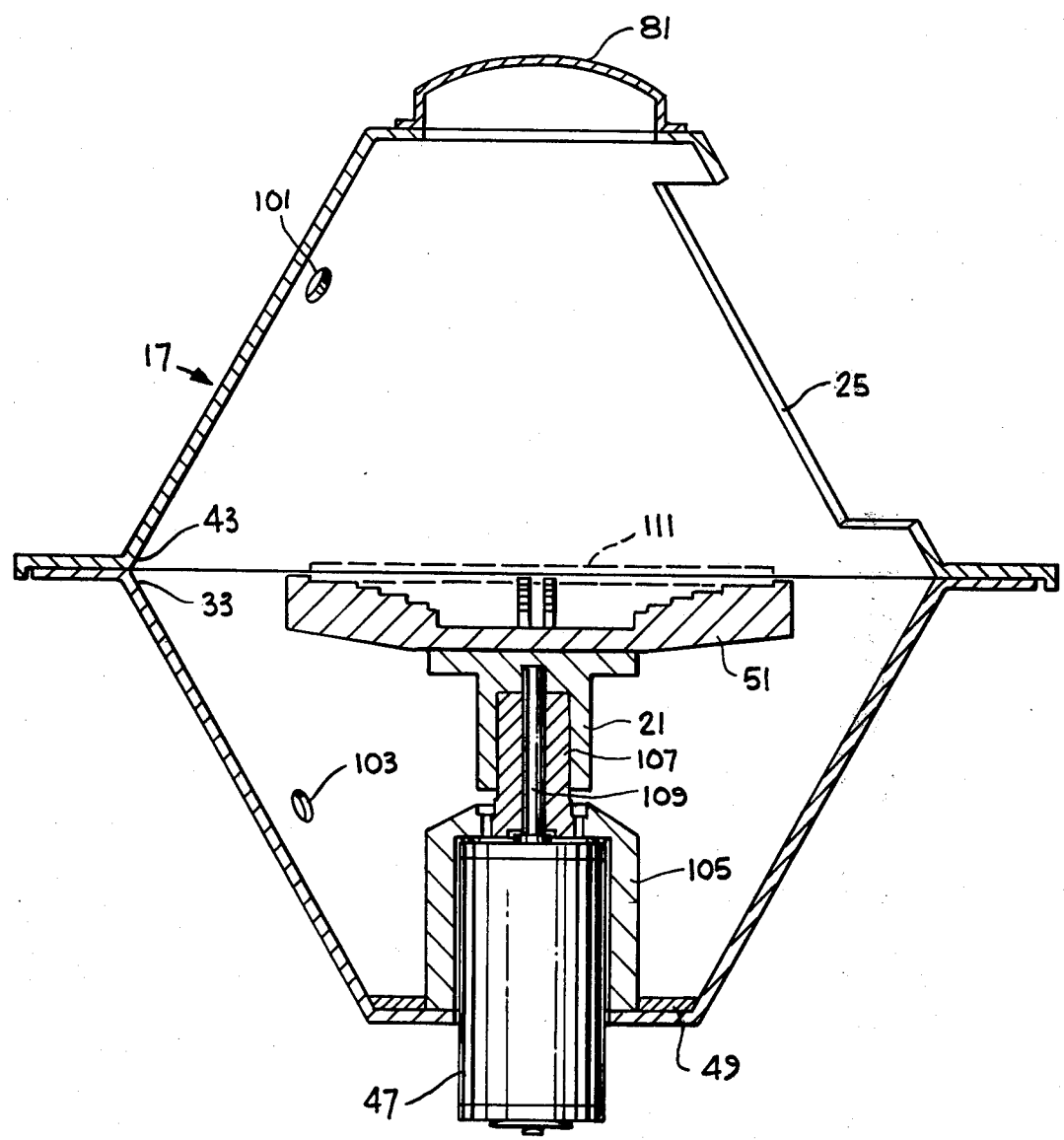
FIG. 6 is a side sectional view interior of the chamber of the present apparatus.

FIG. 6 shows the interior of housing 17. Nozzle tips 101 and 103 are shown to be mounted flush against the inside wall of the chamber. Motor 47 is shown to be mounted in an upright position supported by base plate 49 and surrounded by a protective enclosure 105. Spinner chuck 21 is mounted on spindle 107 which coaxially surrounds and protects rotary motor shaft 109. It is necessary to use protective enclosures 105 and 107 to protect motor parts from corrosives which are used as photoplate processing fluids. Photoplate holder 51 is seen to be mounted directly atop the spinner chuck 21 and the staircase profile of the arms of the holder are clearly visible. A photoplate mounted in holder 51 is indicated by the dashed line 111. It will be seen that the entire chamber 71 is closed except that a slideable door 25 is provided so that access may be had to holder 51 and photoplates thereon. Lamp housing 81 may be seen to be mounted directly over the photoplate holder 51, but this is not critical and, in fact, the lamp holder may be mounted on a side wall of chamber 17 as long as it does not interfere with any of the spray jets.

The spray jets and the motors should be capable of spraying at a rate of at least 0.02 gallons per minute for all process chemicals. The motor 47 should preferably be capable of two speeds of operation, including a slow speed of approximately 400–500 rpm and a high speed of 2800–3000 rpm, although these particular rates are not critical.

The maximum diameter of the bowl-shaped members which form chamber 17 is approximately 13 inches at the rims 33, 43. At the truncated region of each bowl, for example, the region of the lower bowl-shaped member which is occupied by base plate 49, the bowl diameter is approximately six inches. Again, these dimensions are not critical, but are illustrated to indicate the compact nature of the in-situ photoplate processing apparatus of the present invention.

FIG. 7 illustrates the method of operation of the present invention in sequence beginning from left to right. A photoplate usually consists of a glass substrate covered by hard surface mask film and is coated with a photoresist material. In order to make semiconductor integrated circuits, the photoplates have previously been selectively exposed and contain latent images which represent patterns for integrated circuits to be made on semiconducting material substrate in subsequent operations. It is necessary to develop the latent images in a way so that the photoplate may be used as a photomask for diffusing impurities or otherwise injecting other substances into the semiconductor material in a semiconductor manufacturing operation.

In any event, the first step of the present method consists of placing selectively exposed photoresist coated photoplate on the previously described spinner chuck. The spinner chuck is then rotated at the slow speed previously described. Then, a spray of developer is directed onto the rotating photoplate through one of the spray jets for a period of approximately 30 seconds. Different developers may require different times as known to those skilled in the art. Next, the photoplate is rinsed with water for 30 seconds which stops the action of the developer. The continuously spinning spinner chuck distributes the sprayed materials over the surface of the photoplate, preventing accumulations in any one place and centrifugal force ultimately forces fluids off of the photoplate toward the chamber walls. A swirling vortex action is promoted within the chamber because of the sloping walls of the chamber interior such that the fluid thrown off from the rotating photoplate lands on the walls of the chamber and is ultimately drained to the base thereof where it may be collected and recycled or discarded.

In the second drawing of FIG. 7, it will be seen that radiation in the form of ultraviolet light is directed downwardly onto previously unexposed layers of photoresist, thereby making these regions available for removal by developer.

In the third drawing of FIG. 7, etchant is sprayed onto the photoplate by a nozzle tip which will dissolve hard surface mask film portions which were underlying selectively exposed photoresist regions, thereby providing apertures in the photoplate which extend down to the glass substrate. Because the etchant material is corrosive, the metal portions of the motor beneath the spinner chuck must be protected, as previously described. For the same reason, it is necessary to protect all fittings, jets and lamp portions which will come in contact with the etchant. After the etchant has been sprayed for approximately 30 seconds, water is sprayed onto the photoplate for approximately 30 seconds, thereby rinsing the etchant from the rotating photoplate. Again, centrifugal action forces fluids from the photoplate onto the interior walls of the chamber and to drainage ports in the base of the chamber. The etching step may preceed exposure with light.

In the fourth illustration of FIG. 7 the remaining photoresist has been removed by stripping it away by spraying developer onto the photoplate for approximately 30 seconds, followed by another 30-second rinse. Lastly, a 45-second high speed rotation, at approximately 2800–3000 rpm, dries the photoplate after which it may be removed from the photoplate holder through a window provided in the top of the chamber.

The times mentioned above for each operation are to be considered exemplary and other times would work, depending on the strength of the solution and spinner chuck rotation speeds, etc. It should be noted, however, that the entire operation as described above takes only four minutes, compared to a typical photoplate processing time of 24 minutes using standard techniques known in the industry. As mentioned previously, the timing is controlled by the controller, and such an apparatus is commercially available, known under the trademark of Quantachron V, from Matrix Corporation, Indiannapolis, Ind.

As may be seen in the description of the above method, the entire photoresist surface may be removed in two steps, leaving hard surface mask film where necessary to define the final photomask product of the method. All of this is accomplished while leaving the photoplate in a single rotary position. By irradiating the photoplate and using developer to strip the plate, a number of chemical stripping agents is eliminated.

The above method and apparatus is not limited to square photoplates, but may be used with any planar film substrate which may be held in a holder.

What is claimed is:

1. An apparatus for in-situ processing of photoplates comprising,
   a lower frustro-conical bowl-shaped member having sloping side walls and a first rim and an upper frustro-conical bowl-shaped member having sloping side walls and a second rim, said first and second rims disposed adjacent to each other such that the sloping side walls of said lower and upper bowls define most of a closed chamber therebetween,
   a motor-driven spinner chuck projecting into the chamber, said chuck having means for rotating a photoplate in a horizontal plane,
   spray means flush mounted to the inside walls of said upper bowl at locations where dripping from said spray means will avoid the horizontally rotating photoplate in the spinner chuck, said spray means for directing photoplate processing fluids onto said photoplate.

2. The apparatus of claim 1 wherein said upper bowl-shaped member includes door means for inserting a photoplate on said spinner chuck photoplate holding means, said door means avoiding crossing said photoplate.

3. The apparatus of claim 1 further defined by a radiation source comprising an actinic lamp mounted in said closed chamber facing said spinner chuck photoplate holding means.

4. The apparatus of claim 1 wherein a motor having fluid protective members surrounding said motor, extends upwardly into said chamber, having a shaft connected for rotating said spinner chuck.

* * * * *